(12) United States Patent
Ogasahara et al.

(10) Patent No.: US 9,020,166 B2
(45) Date of Patent: Apr. 28, 2015

(54) VOLUME AMPLITUDE LIMITING DEVICE

(75) Inventors: Naokazu Ogasahara, Osaka (JP); Yoshihiro Koba, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 367 days.

(21) Appl. No.: 13/581,630

(22) PCT Filed: May 25, 2011

(86) PCT No.: PCT/JP2011/002900
§ 371 (c)(1),
(2), (4) Date: Aug. 29, 2012

(87) PCT Pub. No.: WO2011/148624
PCT Pub. Date: Dec. 1, 2011

(65) Prior Publication Data
US 2012/0328127 A1    Dec. 27, 2012

(30) Foreign Application Priority Data

May 26, 2010 (JP) .................. 2010-120010
Jun. 1, 2010 (JP) .................. 2010-125580

(51) Int. Cl.
*H03G 3/00* (2006.01)
*H03G 9/00* (2006.01)
*H04R 3/00* (2006.01)
*H03G 9/02* (2006.01)
*H03G 3/10* (2006.01)
*H03G 11/00* (2006.01)

(52) U.S. Cl.
CPC .............. *H04R 3/007* (2013.01); *H03G 9/025* (2013.01); *H04R 2499/15* (2013.01); *H04R 2430/01* (2013.01); *H03G 3/10* (2013.01); *H03G 11/002* (2013.01)

(58) Field of Classification Search
CPC ............. H04R 53/007; H04R 2430/01; H03G 11/002; H03G 9/025
USPC ............... 381/104–10, 28, 98, 102, 103, 120, 381/104–109
See application file for complete search history.

(56) References Cited

U.S. PATENT DOCUMENTS

2005/0117758 A1 *  6/2005  Wakabayashi ................. 381/104

FOREIGN PATENT DOCUMENTS

| JP | 8-316760 | 11/1996 |
| JP | 10-294990 | 11/1998 |
| JP | 2008-187623 | 8/2008 |
| JP | 2009-253926 | 10/2009 |

OTHER PUBLICATIONS

International Search Report issued Jun. 28, 2011 in International (PCT) Application No. PCT/JP2011/002900.

* cited by examiner

*Primary Examiner* — Paul S Kim
*Assistant Examiner* — Katherine Faley
(74) *Attorney, Agent, or Firm* — Wenderoth, Lind & Ponack, L.L.P.

(57) ABSTRACT

A volume amplitude limiting device includes a volume adjustment unit, an amplitude limiting unit, and a control unit. The volume adjustment unit adjusts the amplitude of an input sound signal to a larger degree as the adjustment value increases and outputs the resulting sound signal. The amplitude limiting unit limits the amplitude of the sound signal output from the volume adjustment unit to an output limitation value and outputs the resulting signal to a speaker. The control unit sets an adjustment value for the volume adjustment unit and also sets an output limitation value for the amplitude limiting unit according to an adjustment value.

14 Claims, 11 Drawing Sheets

VOLUME AMPLITUDE LIMITING DEVICE

This application is a U.S. national phase application of PCT International Application PCT/JP2011/002900, filed May 25, 2011.

TECHNICAL FIELD

The present invention relates to a volume amplitude limiting device, and more specifically to a volume amplitude limiting device that, for low-volume sound output from a speaker, prevents the sound from becoming unpleasant due to enclosure noise and speaker distortion through amplitude limitation; and for high-volume sound, supplies the sound signal to the speaker up to the rated output.

BACKGROUND ART

Conventionally, to reduce distortion of sound output from a speaker or to suppress overmodulation of broadcast output, a sound signal limiting amplifier that limits sound output to a given value is widely used (refer to Japanese Patent Unexamined Publication No. H08-316760 for example).

Figure 16:
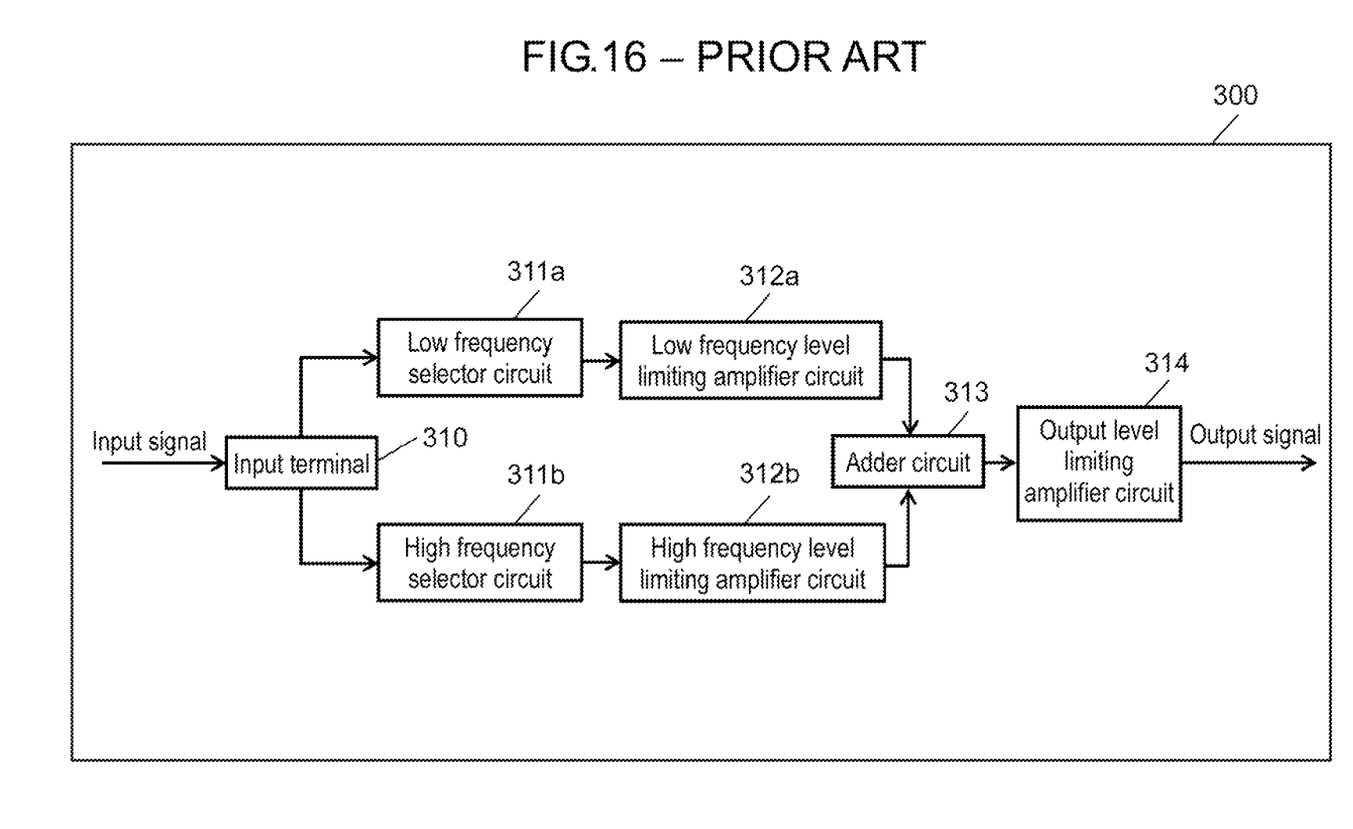
FIG. 16 is a block diagram showing a configuration of a conventional sound signal limiting amplifier.

A description is made of a configuration of sound signal limiting amplifier 300 described in Japanese Patent Unexamined Publication No. H08-316760 using FIG. 16. An input sound signal to input terminal 310 typically contains all the frequency components from low frequency range to high frequency range. The input sound signal passes through low frequency selector circuit 311a as a low-pass filter that limits the frequency bandwidth to a predetermined frequency. On the other hand, the sound signal similarly passes through high frequency selector circuit 311b as a high-pass filter. The sound signals having passed through low frequency level limiting amplifier circuit 312a and high frequency level limiting amplifier circuit 312b are synthesized by adder circuit 313 and are output to output level limiting amplifier circuit 314.

When a signal level of a signal having passed through low frequency selector circuit 311a does not undergo level limitation by low frequency level limiting amplifier circuit 312a and a signal level of a signal having passed through high frequency selector circuit 311b does not undergo level limitation by high frequency level limiting amplifier circuit 312b, a signal synthesized from the two signals by adder circuit 313 is output with its frequency characteristics remaining flat.

Meanwhile, when a sound signal with its amplitude of low-frequency components larger than that of high-frequency components is input to input terminal 310, the sound signal having passed through low frequency selector circuit 311a undergoes level limitation by low frequency level limiting amplifier circuit 312a. On the other hand, a sound signal having passed through high frequency selector circuit 311b does not undergo level limitation by high frequency level limiting amplifier circuit 312b. Hence, conducting the signals through adder circuit 313 provides output signal h with only its low components level-limited and with its high components not level-limited. However, an adding operation by adder circuit 313 can cause a given reference limitation level to be exceeded. In this case, output signal h is level-limited by output level limiting amplifier circuit 314 and is eventually output as output signal i.

In the meantime, a volume amplitude limiting device is typically designed to specifications such that the level of a sound signal to be input does not exceed the maximum rated value of a speaker or sound amplifier. However, equipment with an actual speaker built-in often produces unpleasant sound due to resonance of the housing of the equipment or sound distortion of the speaker even if output from the speaker does not exceed the maximum rated value. Accordingly, to keep pleasant sound quality, sound output needs to be limited within a range lower than the maximum rated value of the speaker or sound amplifier so as to avoid resonance of the housing of the equipment and sound distortion of the speaker. However, with amplitude limitation of a sound signal at such a low value, the rated output value according to product specifications cannot be output.

SUMMARY OF THE INVENTION

A volume amplitude limiting device of the present invention includes a volume adjustment unit, an amplitude limiting unit, and a control unit. The volume adjustment unit adjusts the amplitude of an input sound signal to a larger degree with increase in an adjustment value and outputs the resulting sound signal. The amplitude limiting unit limits the amplitude of the resulting sound signal output from the volume adjustment unit to an output limitation value and outputs the resulting sound signal to a speaker. The control unit sets an adjustment value for the volume adjustment unit and also sets an output limitation value for the amplitude limiting unit according to the adjustment value.

With such a configuration, the control unit of a volume amplitude limiting device of the present invention can set an output limitation value for the amplitude limiting unit according to the adjustment value. Hence, the device limits the amplitude of a low-volume of input sound signal to prevent output from a speaker from becoming unpleasant due to enclosure noise and speaker distortion while supplying high-volume sound to the speaker up to the rated output value.

DESCRIPTION OF EMBODIMENTS

First Exemplary Embodiment

Figure 1:
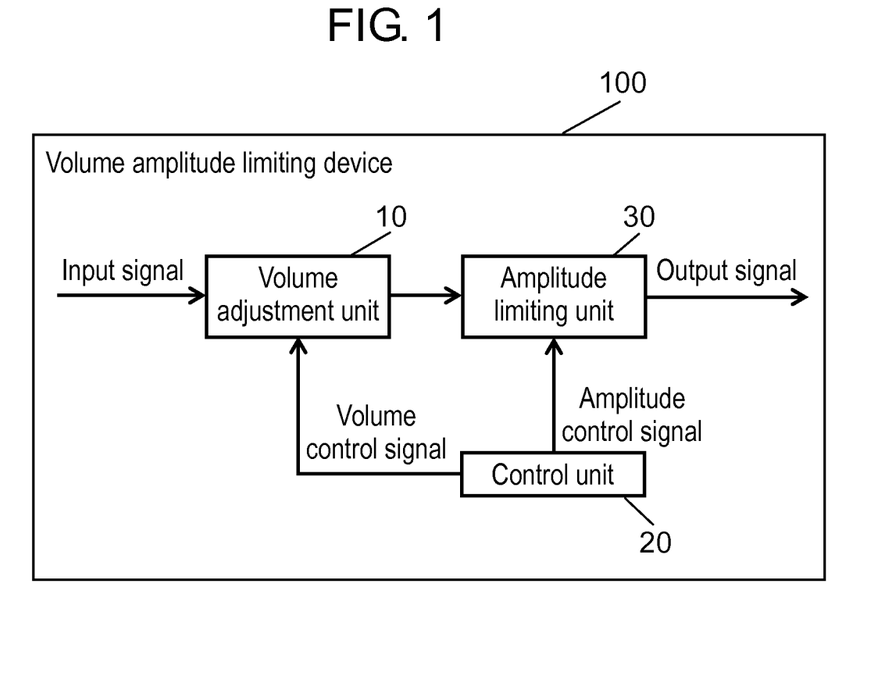
FIG. 1 is a block diagram showing a configuration of a volume amplitude limiting device according to the first exemplary embodiment of the present invention.

A description is made of the best-mode embodiment of the present invention with reference to the related drawings. FIG. 1 is a block diagram showing a configuration of volume amplitude limiting device 100 according to the first exemplary embodiment of the present invention. Hereinafter, a description is made of an example where device 100 is applied to a sound output device equipped in an apparatus such as a TV set. Device 100 includes volume adjustment unit 10, amplitude limiting unit 30, and control unit 20.

Next, a description is made of operation of each component of volume amplitude limiting device 100 configured as above.

Volume adjustment unit 10 adjusts the amplitude of an input sound signal according to an adjustment value contained in a volume control signal input from control unit 20. Unit 10 adjusts the amplitude to a larger degree with increase in a larger adjustment value and outputs the resulting sound signal to amplitude limiting unit 30.

Amplitude limiting unit 30 limits the amplitude of resulting sound signal output from volume adjustment unit 10 to an output limitation value contained in an amplitude control signal input from control unit 20 and outputs the resulting sound signal as an output signal to a speaker (not shown). If the amplitude of an input sound signal is not larger than the output limitation value, amplitude limiting unit 30 directly outputs the sound signal as an output signal to the speaker.

Figure 2:
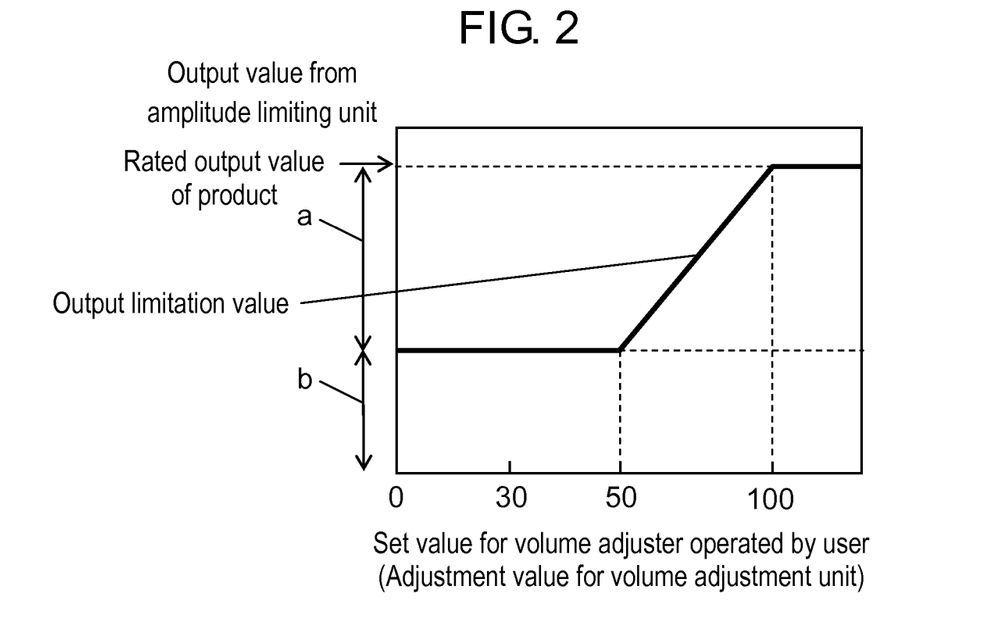
FIG. 2 shows an example of a concept by which the control unit of the volume amplitude limiting device controls the amplitude limiting unit according to the first exemplary embodiment of the present invention.

Control unit 20 sets a volume adjustment value for volume adjustment unit 10 according to a volume control signal and exercises control for setting an output limitation value for amplitude limiting unit 30 according to the adjustment value having been set. A detailed description is made of a concrete way of controlling using FIGS. 2 through 6. FIG. 2 shows an example of a concept by which control unit 20 of volume amplitude limiting device 100 according to the first embodiment of the present invention controls amplitude limiting unit 30.

First, a description is made of control of an output limitation value for amplitude limiting unit 30 exercised by control unit 20, using FIG. 2. Control unit 20 changes the amplitude of a sound signal for volume adjustment unit 10 according to operation of a volume adjuster (not shown in FIG. 1) by the user. FIG. 2 illustrates relationship between a set value for the volume adjuster operated by the user and an output limitation value for amplitude limiting unit 30. In FIG. 2, the set value for the volume adjuster indicates "0" for the minimum volume; "100" for the maximum volume as an example. The vertical axis represents an output value from amplitude limiting unit 30. Range b of output values shown in FIG. 2 is an output range of output signals from amplitude limiting unit 30 within which speaker distortion does not occur. Range a of output values is an output range of output signals from amplitude limiting unit 30 within which speaker distortion occurs. Further, the rated output value according to the product specifications is shown at the top end of the vertical axis. Here, in the range within which speaker distortion does not occur, speaker distortion is assumed to be undetectable by a typical user in sound generated from a speaker.

When the set value for the volume adjuster is not smaller than "0" and not larger than "50" as a given value, the output limitation value for amplitude limiting unit 30 is set to the top end (upper limit) of range b of output values. Herewith, as long as the set value for the volume adjuster is between "0" and "50", the amplitude of a sound signal for amplitude limiting unit 30 is output-limited to the output limitation value even if a large-amplitude input signal exceeding range b of output values is input to amplitude limiting unit 30. Hence, control unit 20 exercises control so as to suppress speaker distortion through output limitation even in a case where range a is applicable within which speaker distortion would occur if output limitation were not performed by amplitude limiting unit 30.

Here, why the given value of the set value for the volume adjuster is "50" is that the intermediate value between "0" and "100" has been chosen as a set value for the volume adjuster. However, the given value is not limited to "50" but a value between approximately "30" and approximately "75" for example may be chosen as appropriate. Arrangements may be made so that the user can choose the value.

The following case can occur. That is, the set value for the volume adjuster is between "0" and "50", a large-amplitude input signal is input to volume adjustment unit 10, and the amplitude of a sound signal for volume adjustment unit 10 is steadily fixed to the top end of range b of output values. In such a case, the amplitude of a sound signal for volume adjustment unit 10 does not change even if the user changes the set value for the volume adjuster. This causes the user to feel slightly uncomfortable regarding operation of the volume adjuster.

When the set value for the volume adjuster exceeds "50" as a given value, the output limitation value for amplitude limiting unit 30 is set so as to gradually increase from the top end of range b as the set value for the volume adjuster gradually increases from beyond "50". If the set value for the volume adjuster is a maximum of "100" or larger, the output limitation value for amplitude limiting unit 30 is set so as to reach the rated output value (maximum value) according to the product specifications. Consequently, when a large-amplitude input signal is input, speaker distortion is to gradually increase by gradually increasing the set value for the volume adjuster from beyond "50". At the maximum set value for the volume adjuster, a sound signal is output with the rated output value according to the product specifications from amplitude limiting unit 30.

In other words, in a case in which the adjustment value is not larger than the given value, control unit 20 of volume amplitude limiting device 100 according to the embodiment sets the output limitation value for amplitude limiting unit 30 to the upper limit in a range within which speaker distortion does not occur.

When the adjustment value having been set is larger than a given value, control unit 20 sets the output limitation value for amplitude limiting unit 30 to a value between the upper limit (where the adjustment value is not larger than the given value) and the given maximum value. Hence, when the user changes the set value for the volume adjuster, the amplitude of a sound signal for amplitude limiting unit 30 changes even if output limitation by amplitude limiting unit 30 functions as a result that a large-amplitude input signal has been input to volume adjustment unit 10. This does not cause the user to feel uncomfortable regarding operation of the volume adjuster when the adjustment value having been set is larger than the given value.

The set value for the volume adjuster, the set value of the output limitation value, and the settings for these mutual relationships used for the above description are an example, and the present invention is not limited to them. For example, as shown in FIG. 2, for a set value for the volume adjuster between "50" and "100", the relationship between the set value for the volume adjuster and the output limitation value for amplitude limiting unit 30 is shown as a straight line. However, the relationship may be an upward-convex, downward-convex, or gently inflected curve.

In other words, control unit 20 of volume amplitude limiting device 100 according to the embodiment desirably sets the output limitation value for amplitude limiting unit 30 so as not to change or to increase as the adjustment value increases. In this way, when the user changes the set value for the volume adjuster so as to be increased, the amplitude of a sound signal for amplitude limiting unit 30 changes so as to be increased even if output limitation by amplitude limiting unit 30 functions as a result that a large-amplitude input signal has been input to volume adjustment unit 10. Meanwhile, when the user changes the set value for the volume adjuster so as to be decreased, the amplitude of a sound signal for amplitude limiting unit 30 changes so as to be decreased. This does not cause the user to feel uncomfortable regarding operation of the volume adjuster even when the adjustment value having been set is larger than the given value.

Hereinafter, a description is made of various examples where control unit 20 controls the output limitation value for amplitude limiting unit 30 using FIGS. 3 through 6. FIGS. 3 through 6 show an example of a concept by which control unit 20 of volume amplitude limiting device 100 controls amplitude limiting unit 30.

Figure 3:
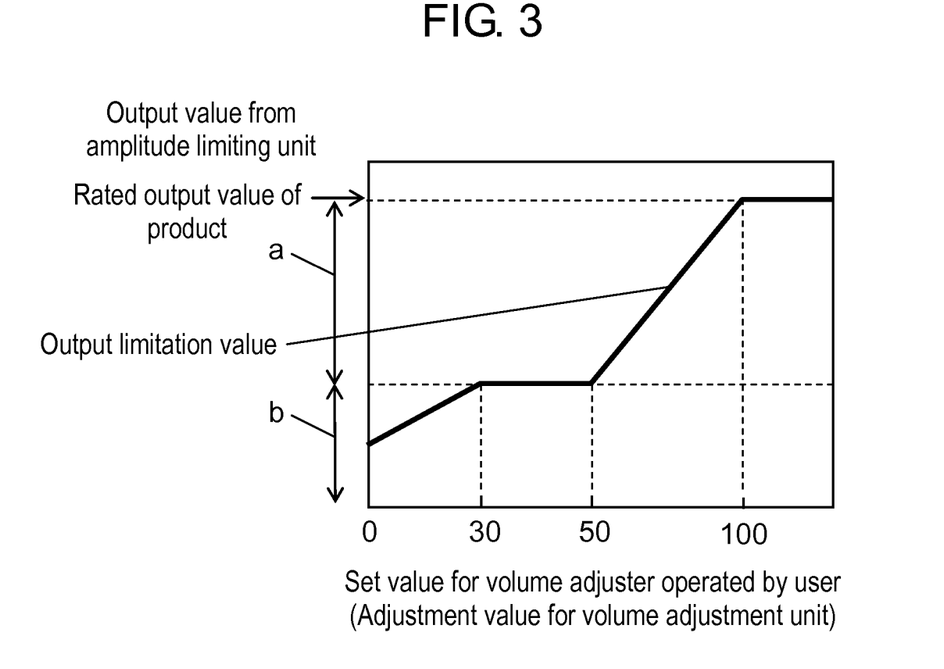
FIG. 3 shows another example of a concept by which the control unit of the volume amplitude limiting device controls the amplitude limiting unit according to the first exemplary embodiment of the present invention.

FIG. 3 is different from FIG. 2 that shows how control unit 20 controls the output limitation value for amplitude limiting unit 30 in that, below or equal to a set value for the volume adjuster of "30", the output limitation value is set to a gradually larger value as the set value for the volume adjuster increases. By exercising control in this way, noise with an amplitude remarkably higher than usual can be effectively suppressed for an extremely small set value for the volume adjuster such as not larger than "30".

Figure 4:
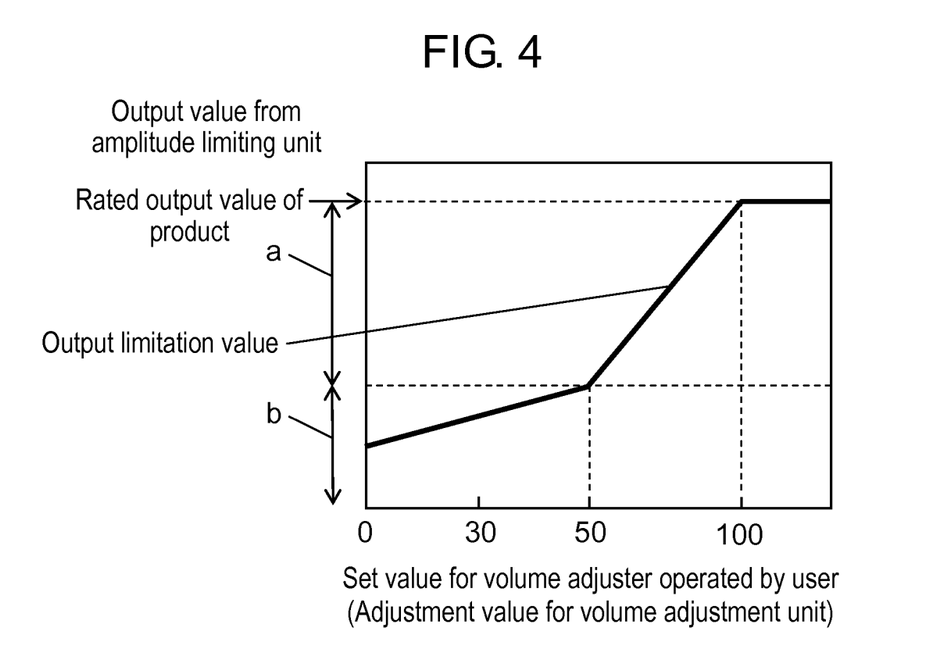
FIG. 4 shows yet another example of a concept by which the control unit of the volume amplitude limiting device controls the amplitude limiting unit according to the first exemplary embodiment of the present invention.

Similarly, FIG. 4 is different from FIG. 2 that shows how control unit 20 controls the output limitation value for amplitude limiting unit 30 in that, below or equal to a set value for the volume adjuster of "50", the output limitation value is set to a gradually larger value as the set value for the volume adjuster increases. In this case, in addition to the advantage described in FIG. 3, the output limitation value for amplitude limiting unit 30 is set so as to gradually increase as the set value for the volume adjuster increases in the entire range of set values for the volume adjuster. Hence, when the user changes the set value for the volume adjuster so as to be increased, the amplitude of a sound signal for amplitude limiting unit 30 changes so as to be increased even if output limitation by amplitude limiting unit 30 functions as a result that a large-amplitude input signal has been input to volume adjustment unit 10. Meanwhile, when the user changes the set value for the volume adjuster so as to be decreased, the amplitude of a sound signal for amplitude limiting unit 30 changes so as to be decreased. This does not cause the user to feel uncomfortable regarding operation of the volume adjuster even when the adjustment value having been set is larger than the given value.

Figure 5:
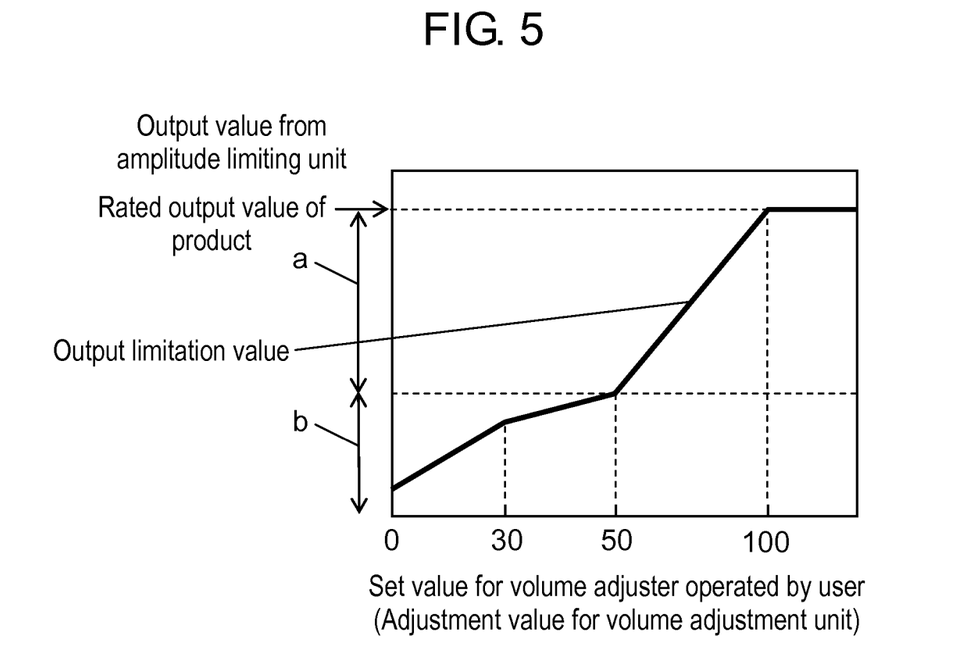
FIG. 5 shows still another example of a concept by which the control unit of the volume amplitude limiting device controls the amplitude limiting unit according to the first exemplary embodiment of the present invention.
Figure 6:
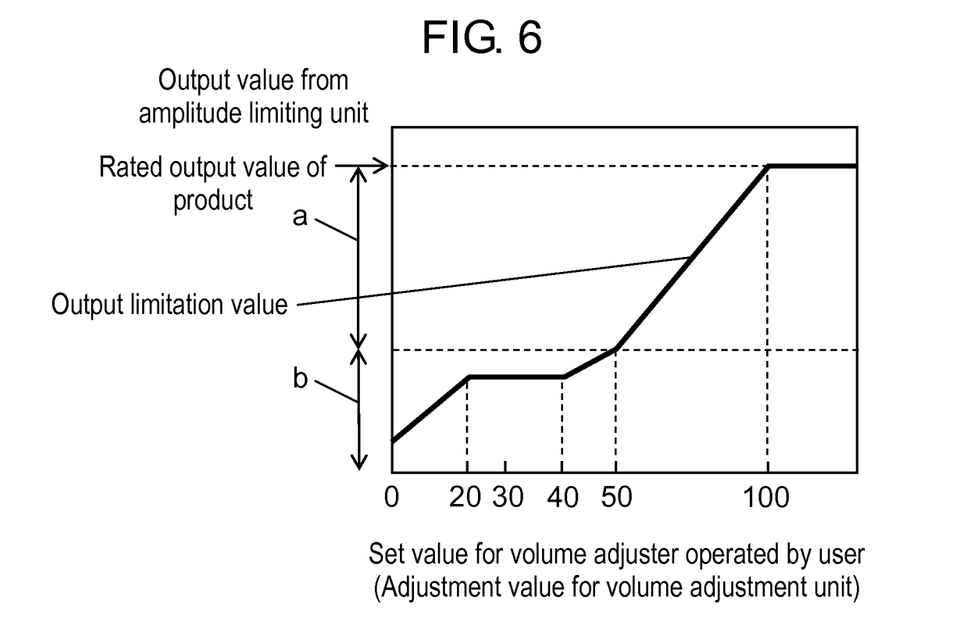
FIG. 6 shows further another example of a concept by which the control unit of the volume amplitude limiting device controls the amplitude limiting unit according to the first exemplary embodiment of the present invention.

FIGS. 5 and 6 show an example where the output limitation value rapidly decreases as the set value for the volume adjuster decreases below or equal to a set value for the volume adjuster of "30" or "20". Consequently, when the adjustment value having been set is not larger than the given value, control unit 20 of volume amplitude limiting device 100 according to the embodiment may set the output limitation value for amplitude limiting unit 30 to a value below or equal to the upper limit in a range within which speaker distortion does not occur. With such settings, control unit 20 exercises control so as to strongly suppress speaker distortion through output limitation even in a case where range a is applicable within which speaker distortion would occur if output limitation were not performed by amplitude limiting unit 30.

Second Exemplary Embodiment

Figure 7:
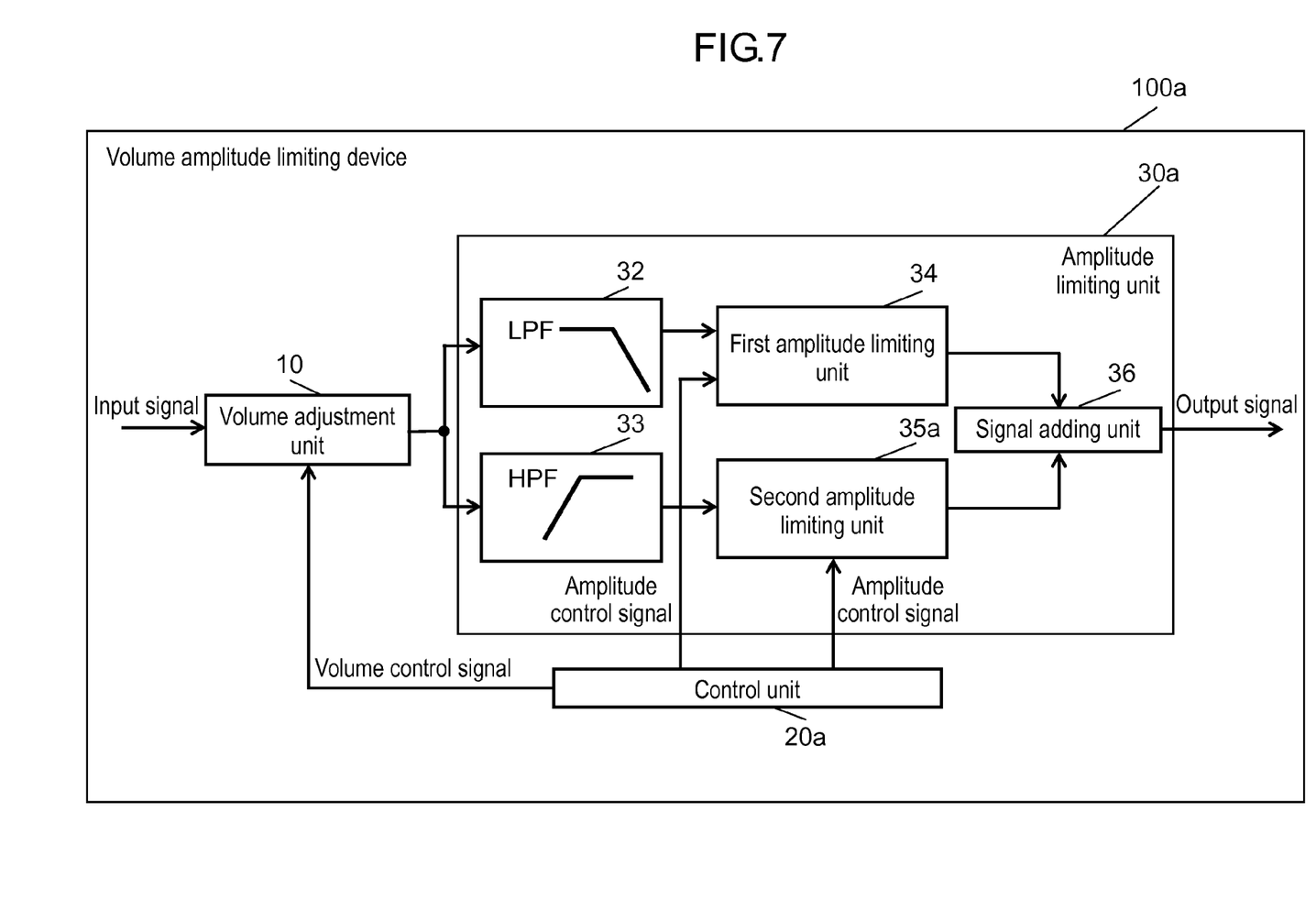
FIG. 7 is a block diagram showing a configuration of a volume amplitude limiting device according to the second exemplary embodiment of the present invention.

In the first embodiment, as shown in FIG. 1, volume amplitude limiting device 100 is configured to input all the frequency bands of sound signals output from volume adjustment unit 10 to amplitude limiting unit 30 and to limit the amplitude of a sound signal output from volume adjustment unit 10 to the output limitation value for amplitude limiting unit 30. As shown in FIG. 7, the second embodiment is different from the first in that volume amplitude limiting device 100a separates sound signals output from volume adjustment unit 10 into two frequency bands and inputs the respective resulting signals to first amplitude limiting unit 34 and second amplitude limiting unit 35a. Further, the second embodiment is different from the first in that control unit 20a exercises control for settings a first output limitation value to first amplitude limiting unit 34 and for setting a second output limitation value to second amplitude limiting unit 35a.

FIG. 7 is a block diagram showing a configuration of volume amplitude limiting device 100a according to the second embodiment of the present invention. As shown in FIG. 7, device 100a includes volume adjustment unit 10, amplitude limiting unit 30a, and control unit 20a. Amplitude limiting unit 30a includes low-pass filter (abbreviated as "LPF" in FIG. 7) 32 as a first bandpass filter, high-pass filter (abbreviated as "HPF" in FIG. 7) 33 as a second bandpass filter, first amplitude limiting unit 34, second amplitude limiting unit 35a, and signal adding unit 36.

Next, a description is made of operation of each component of volume amplitude limiting device 100a structured as above. Volume adjustment unit 10 adjusts the amplitude of an input sound signal according to an adjustment value contained in a volume control signal input from control unit 20a. Then, volume adjustment unit 10 outputs the sound signal with its amplitude adjusted to low-pass filter 32 and high-pass filter 33. Low-pass filter 32 limits the band of a sound signal input from volume adjustment unit 10 to 100 Hz or lower for example and outputs only the low-sound part of the sound signal to first amplitude limiting unit 34. High-pass filter 33 limits the band of a sound signal input from volume adjustment unit 10 to 200 Hz or higher for example and outputs only the middle-sound part to high-sound part of the sound signal to second amplitude limiting unit 35a. Here, the above-described concrete frequencies for band limitation are presented as an example and can be set as appropriate. Hence, these values for limiting the band of a sound signal are not limited to the above-described values. For example, low-pass filter 32 may limit the band to 500 Hz or lower for example; high-pass filter 33, to 700 Hz or higher for example.

When the amplitude of a sound signal input from low-pass filter 32 is higher than the first output limitation value, first amplitude limiting unit 34 limits the amplitude of the input sound signal to the first output limitation value contained in an amplitude control signal from control unit 20a and outputs the resulting sound signal to signal adding unit 36. When the amplitude of a sound signal input from low-pass filter 32 is not larger than the first output limitation value, first amplitude limiting unit 34 directly outputs the sound signal to signal adding unit 36.

When the amplitude of a sound signal input from high-pass filter 33 is higher than the second output limitation value, second amplitude limiting unit 35a limits the amplitude to the second output limitation value contained in an amplitude control signal from control unit 20a and outputs the resulting signal to signal adding unit 36. When the amplitude of a sound signal input from high-pass filter 33 is not larger than the second output limitation value, second amplitude limiting unit 35a directly outputs the sound signal to signal adding unit 36.

Signal adding unit 36 adds a sound signal input from first amplitude limiting unit 34 and a sound signal input from second amplitude limiting unit 35a and outputs the resulting sound signal as an output signal to a speaker (not shown).

Figure 8:
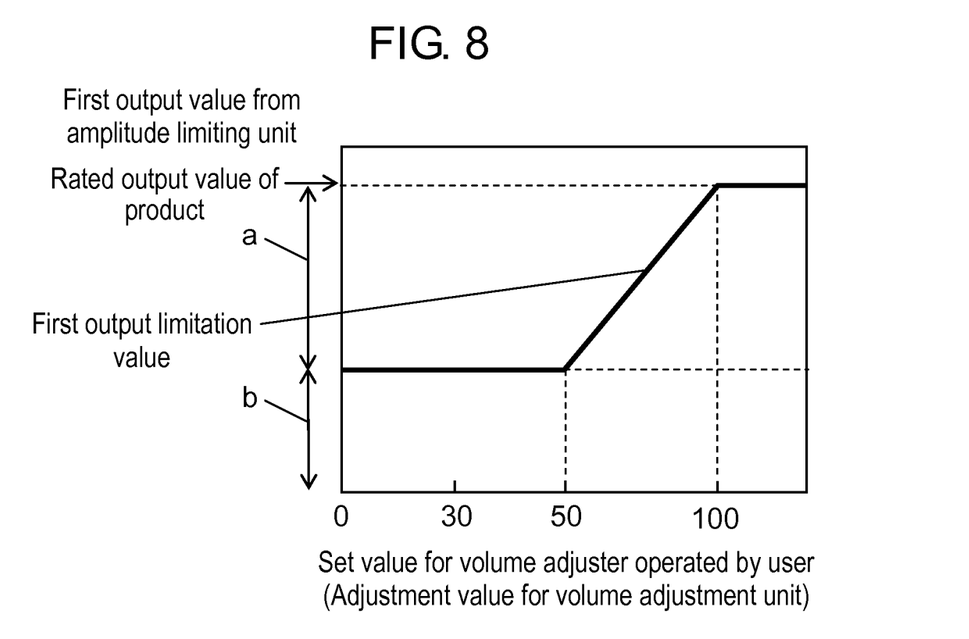
FIG. 8 shows an example of a concept by which the control unit of the volume amplitude limiting device controls the first amplitude limiting unit according to the second exemplary embodiment of the present invention.
Figure 9:
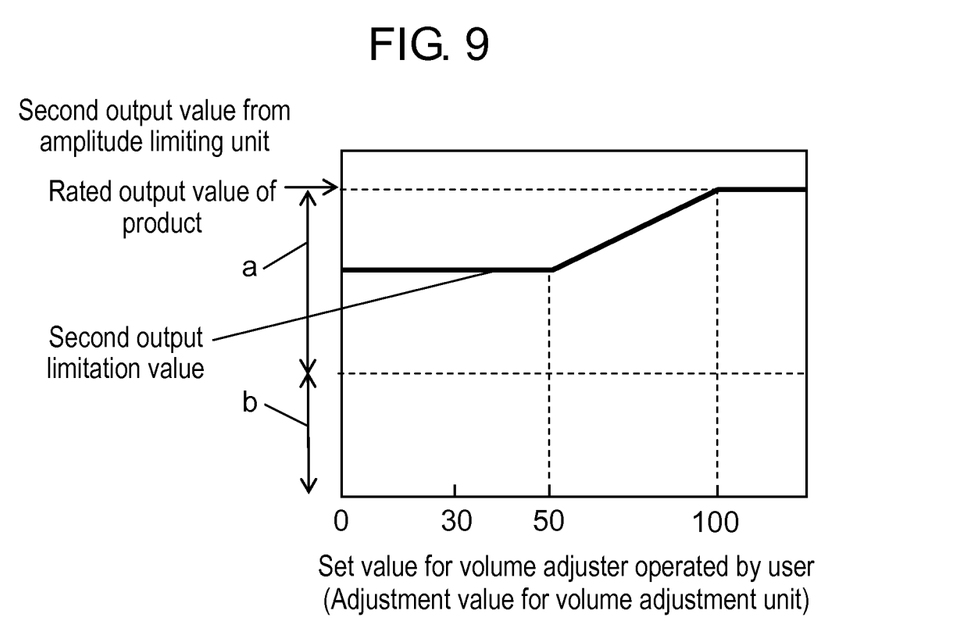
FIG. 9 shows an example of a concept by which the control unit of the volume amplitude limiting device controls the second amplitude limiting unit according to the second exemplary embodiment of the present invention.
Figure 10:
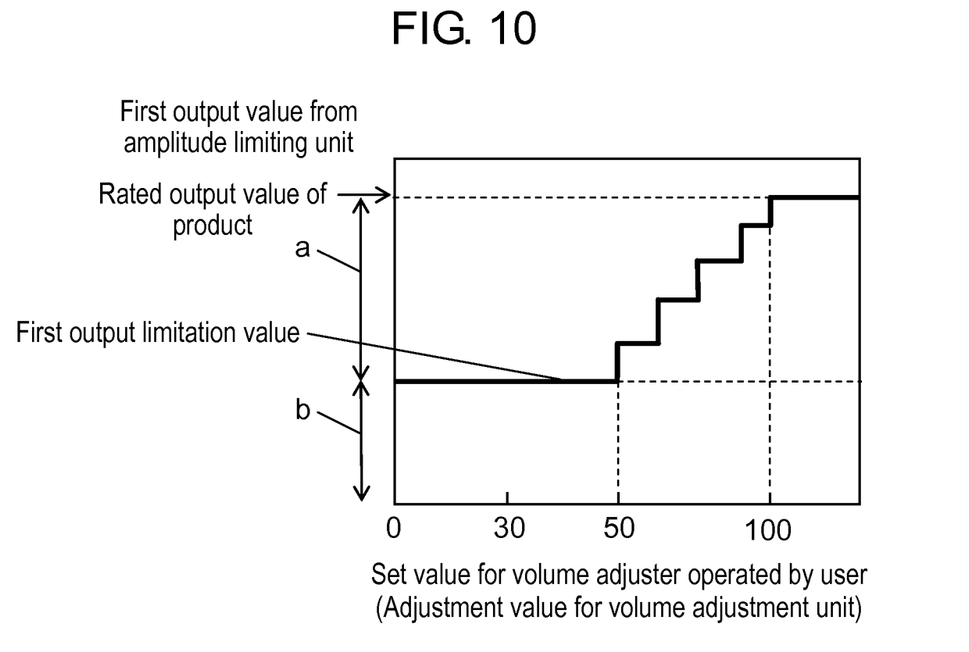
FIG. 10 shows another example of a concept by which the control unit of the volume amplitude limiting device controls the first amplitude limiting unit according to the second exemplary embodiment of the present invention.

Control unit 20a sets an adjustment value for volume adjustment unit 10 according to a volume control signal and also exercises control for setting a first output limitation value for first amplitude limiting unit 34 and a second output limitation value for second amplitude limiting unit 35a according to the adjustment value having been set. A detailed description is made of a concrete way of controlling using FIGS. 8 through 10. FIGS. 8 and 10 show an example of a concept by which control unit 20a of volume amplitude limiting device 100a according to the second embodiment controls first amplitude limiting unit 34. FIG. 9 shows an example of a concept by which control unit 20a controls second amplitude limiting unit 35a.

First, a description is made of how control unit 20a controls a first output limitation value for first amplitude limiting unit 34, using FIG. 8. Control unit 20a changes the amplitude of a sound signal for volume adjustment unit 10 according to operation of a volume adjuster (not shown in FIG. 7) by the user. FIG. 8 illustrates a relationship between a set value for the volume adjuster operated by the user and a first output limitation value for first amplitude limiting unit 34. The horizontal axis represents a set value for the volume adjuster operated by the user. In FIG. 8, the set value for the volume adjuster indicates "0" for the minimum volume; "100" for the maximum volume as an example. The vertical axis represents an output value from amplitude limiting unit 34. Range b of output values shown in FIG. 8 is an output range of output signals from amplitude limiting unit 34 within which speaker distortion does not occur. Range a of output values is an output range of output signals from first amplitude limiting unit 34 within which speaker distortion occurs. Further, the rated output value according to the product specifications is shown at the top end of the vertical axis. Here, in the range within which speaker distortion does not occur, speaker distortion is assumed to be undetectable by a typical user in sound generated from a speaker.

When the set value for the volume adjuster is not smaller than "0" and not larger than "50" as a given value, the first output limitation value for first amplitude limiting unit 34 is set to the top end (upper limit) of range b. Herewith, as long as the set value for the volume adjuster is between "0" and "50", the amplitude of a sound signal for amplitude limiting unit 34 is output-limited to within range b of first output limitation values even if a large-amplitude input signal beyond range b of output values is input to first amplitude limiting unit 34. Hence, control unit 20a exercises control so as to suppress speaker distortion through output limitation even in a case where range a is applicable within which speaker distortion would occur if output limitation were not performed by first amplitude limiting unit 34.

When the set value for the volume adjuster exceeds "50", the first output limitation value for first amplitude limiting unit 34 is set so as to gradually increase from the top end of range b as the set value for the volume adjuster gradually increases from beyond "50". When the set value for the volume adjuster is a maximum of "100" or larger, the first output limitation value for first amplitude limiting unit 34 is set so as to reach the rated output value (maximum value) according to the product specifications. Consequently, when a large-amplitude input signal is input, speaker distortion is to gradually increase by gradually increasing the set value for the volume adjuster from beyond "50". At the maximum set value for the volume adjuster, a sound signal is output with the rated output value according to the product specifications.

The set value for the volume adjuster, the set value of the first output limitation value, and the settings for these mutual relationship used for the above description are an example, and the present invention is not limited to them. For example, as shown in FIG. 8, for a set value for the volume adjuster between "50" and "100", the relationship between the set value for the volume adjuster and the first output limitation value for first amplitude limiting unit 34 is shown as a straight line. However, the relationship may be an upward-convex, downward-convex, or gently inflected curve.

Furthermore, the relationship may be that shown in FIGS. 3 through 6 described in the first embodiment. Specifically, when the adjustment value having been set is not larger than a given value, control unit 20a of volume amplitude limiting device 100a according to the embodiment sets the output limitation value for first amplitude limiting unit 34 to a value not larger than the upper limit in a range within which speaker distortion does not occur. When the adjustment value having been set is larger than the given value, control unit 20 sets the first output limitation value for first amplitude limiting unit 34 to a value between the upper limit and the given maximum value. With such settings, as described using FIG. 20, control unit 20 exercises control so as to further strongly suppress speaker distortion through output limitation even in a case where range a is applicable within which speaker distortion would occur if output limitation were not performed by amplitude limiting unit 30.

As described above, control unit 20a of volume amplitude limiting device 100a according to the embodiment desirably sets the output limitation value for first amplitude limiting unit 34 so as not to change or to increase as the adjustment value increases. In this way, when the user changes the set value for the volume adjuster so as to be increased, the amplitude of a sound signal for signal adding unit 36 changes so as to be increased even if output limitation by first amplitude limiting unit 34 functions as a result that a large-amplitude input signal has been input to volume adjustment unit 10. Meanwhile, when the user changes the set value for the volume adjuster so as to be decreased, the amplitude of a sound signal for amplitude limiting unit 30 changes so as to be decreased. This does not cause the user to feel uncomfortable even when the adjustment value having been set is larger than the given value.

Next, a description is made of how control unit 20a controls a second output limitation value for second amplitude limiting unit 35a using FIG. 9. FIG. 9 shows relationship between the set value for the volume adjuster and a second output limitation value for second amplitude limiting unit 35a. The basic operation of second amplitude limiting unit 35a by control unit 20a is the same as that described on first amplitude limiting unit 34 using FIG. 8. For example, when the adjustment value having been set is larger than a given value, the second output limitation value for second amplitude limiting unit 35a may be set to a value between the upper limit and the given maximum value. The difference from FIG. 8 is that the set value of the second output limitation value is set to a value different from that of the first output limitation value shown in FIG. 8. In other words, control unit 20a of volume amplitude limiting device 100a according to the embodiment sets the second output limitation value for second amplitude limiting unit 35a to a value larger than the first output limitation value for first amplitude limiting unit 34.

According to this embodiment, by exercising such control, a sound signal undergoes output limitation with a relatively low amplitude of the sound signal under or equal to an adjustment value of "50" for the low-sound part where speaker distortion is easily noticeable. For the middle- and high sound part, speaker distortion is less noticeable than for the low, and thus a sound signal undergoes output limitation with a value higher than that. This prevents the level of volume sense to be limited for a volume adjustment value of around "50".

In this embodiment, the description is made of the case where, for a set value between "0" and "50", the second output limitation value for second amplitude limiting unit 35a is set to a value larger than the first output limitation value for first amplitude limiting unit 34; however, the case is an example and the invention is not limited to this setting.

As shown in FIG. 9, for a set value for the volume adjuster between "50" and "100", the relationship between the set value for the volume adjuster and the second output limitation value for second amplitude limiting unit 35a is shown as a straight line. However, the relationship may be an upward-convex, downward-convex, or gently inflected curve.

In other words, control unit 20a of volume amplitude limiting device 100a according to the embodiment desirably sets the second output limitation value for second amplitude limiting unit 35a so as not to change or to increase as the adjustment value increases. In this way, when the user changes the set value for the volume adjuster so as to be increased, the amplitude of a sound signal for signal adding unit 36 changes so as to be increased even if output limitation by second amplitude limiting unit 35a functions as a result that a large-amplitude input signal has been input to volume adjustment unit 10. Meanwhile, when the user changes the set value for the volume adjuster so as to be decreased, the amplitude of a sound signal for amplitude limiting unit 30 changes so as to be decreased. This does not cause the user to feel uncomfortable even when the adjustment value having been set is larger than the given value.

Next, a description is made of an example of a concept by which control unit 20a of volume amplitude limiting device 100a according to the second embodiment of the present invention controls first amplitude limiting unit 34, using FIG. 10. As shown in FIG. 10, when an adjustment value having been set is not larger than a given value, control unit 20a sets the first output limitation value for first amplitude limiting unit 34 to the upper limit in a range within which speaker distortion does not occur. When the adjustment value having been set is larger than the given value, control unit 20a increases the first output limitation value for first amplitude limiting unit 34 by a given increment for a given increment of the adjustment value between the upper limit and the given maximum value of the first output limitation value for first amplitude limiting unit 34; and sets the first output limitation value for first amplitude limiting unit 34 to a value between the upper limit (where an adjustment value having been set is smaller than the given value) and the given maximum value. Even with such settings, control by control unit 20a suppresses speaker distortion through output limitation.

Figure 11:
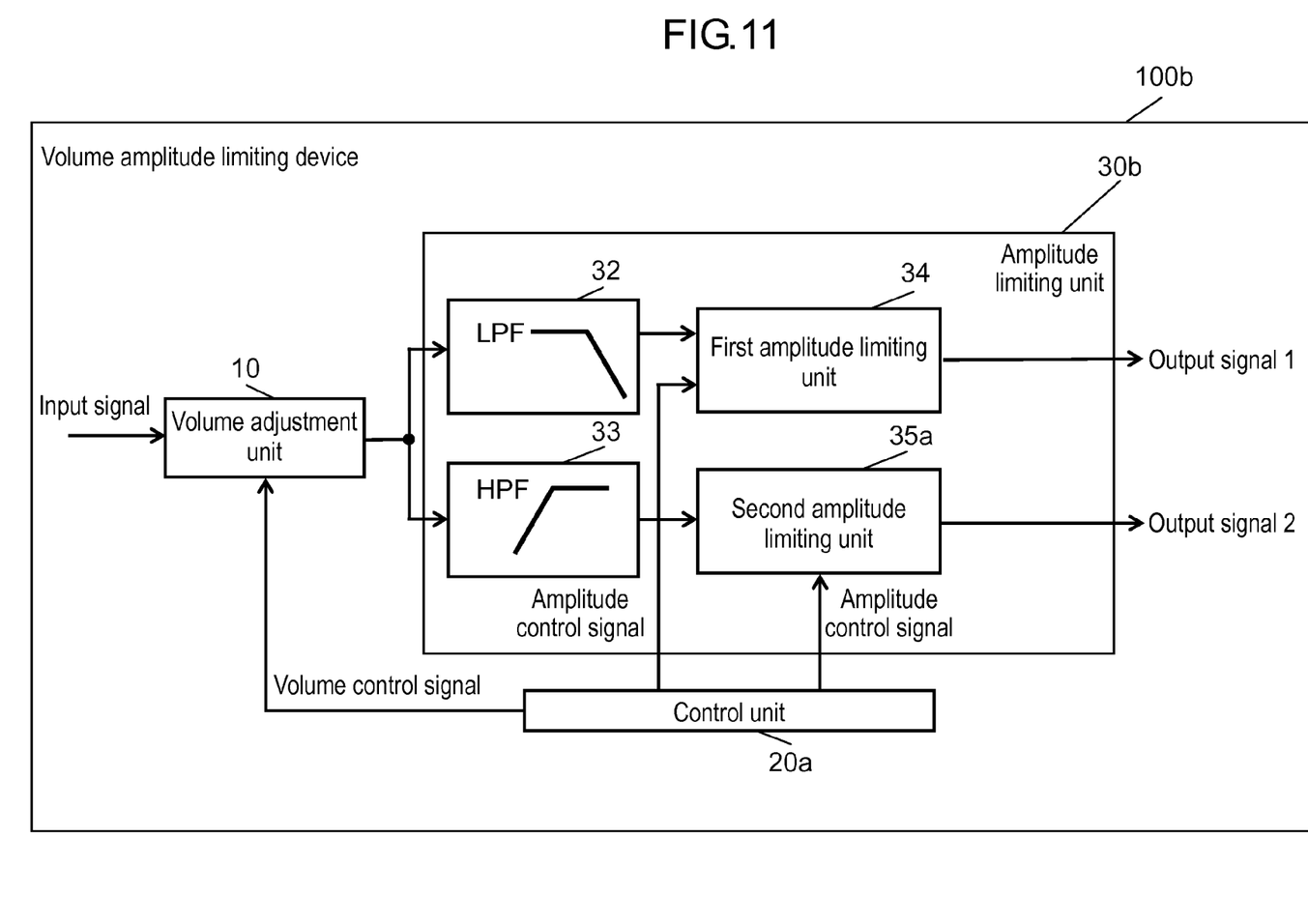
FIG. 11 is a block diagram showing a configuration of another example of a volume amplitude limiting device according to the second embodiment according to the second exemplary embodiment of the present invention.

As shown in FIG. 7, volume amplitude limiting device 100a according to the embodiment is provided with signal adding unit 36 assuming that a full-range speaker is used. However, signal adding unit 36 shown in FIG. 7 can be omitted. FIG. 11 is a block diagram showing a configuration of another example of volume amplitude limiting device 100b according to the second embodiment. As shown in FIG. 11, amplitude limiting unit 30b includes low-pass filter (abbreviated as "LPF" in FIG. 12) 32 as a first bandpass filter; high-pass filter (abbreviated as "HPF" in FIG. 12) 33 as a second bandpass filter; first amplitude limiting unit 34; and second amplitude limiting unit 35a.

Consequently, with a speaker system composed of speakers covering different frequency ranges, a sound signal output from first amplitude limiting unit 34 and second amplitude limiting unit 35a may be applied directly to each speaker covering a relevant frequency range, without signal adding unit 36 shown in FIG. 7 provided. With such a configuration, further distortion generated by signal adding unit 36 can be avoided. Besides, the first and second output limitation values can be separately set corresponding to the characteristics of the respective speakers.

For example, when a middle- and high-frequency speaker to which output signal 2 from second amplitude limiting unit 35a is connected has favorable distortion characteristics, the second output limitation value can be set to the rated output value according to the product specifications.

Figure 12:
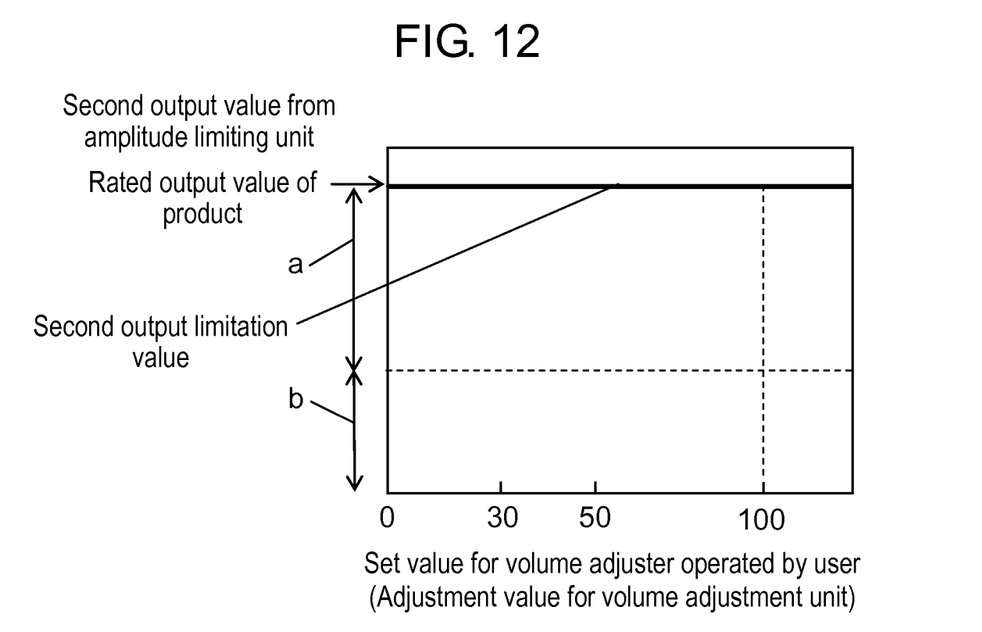
FIG. 12 shows an example of a concept by which the control unit of another example of volume amplitude limiting device controls the second amplitude limiting unit according to the second exemplary embodiment of the present invention.

FIG. 12 shows an example of a concept by which control unit 20a of another example of volume amplitude limiting device 100b according to the second embodiment of the present invention controls second amplitude limiting unit 35a. As shown in FIG. 12, control unit 20a sets a second output limitation value for second amplitude limiting unit 35a to the rated output value according to the product specifications regardless of the adjustment value having been set. In this way, the first and second output limitation values can be optimally set in accordance with the characteristics of speakers connected to output signals 1 and 2, respectively.

Third Exemplary Embodiment

Figure 13:
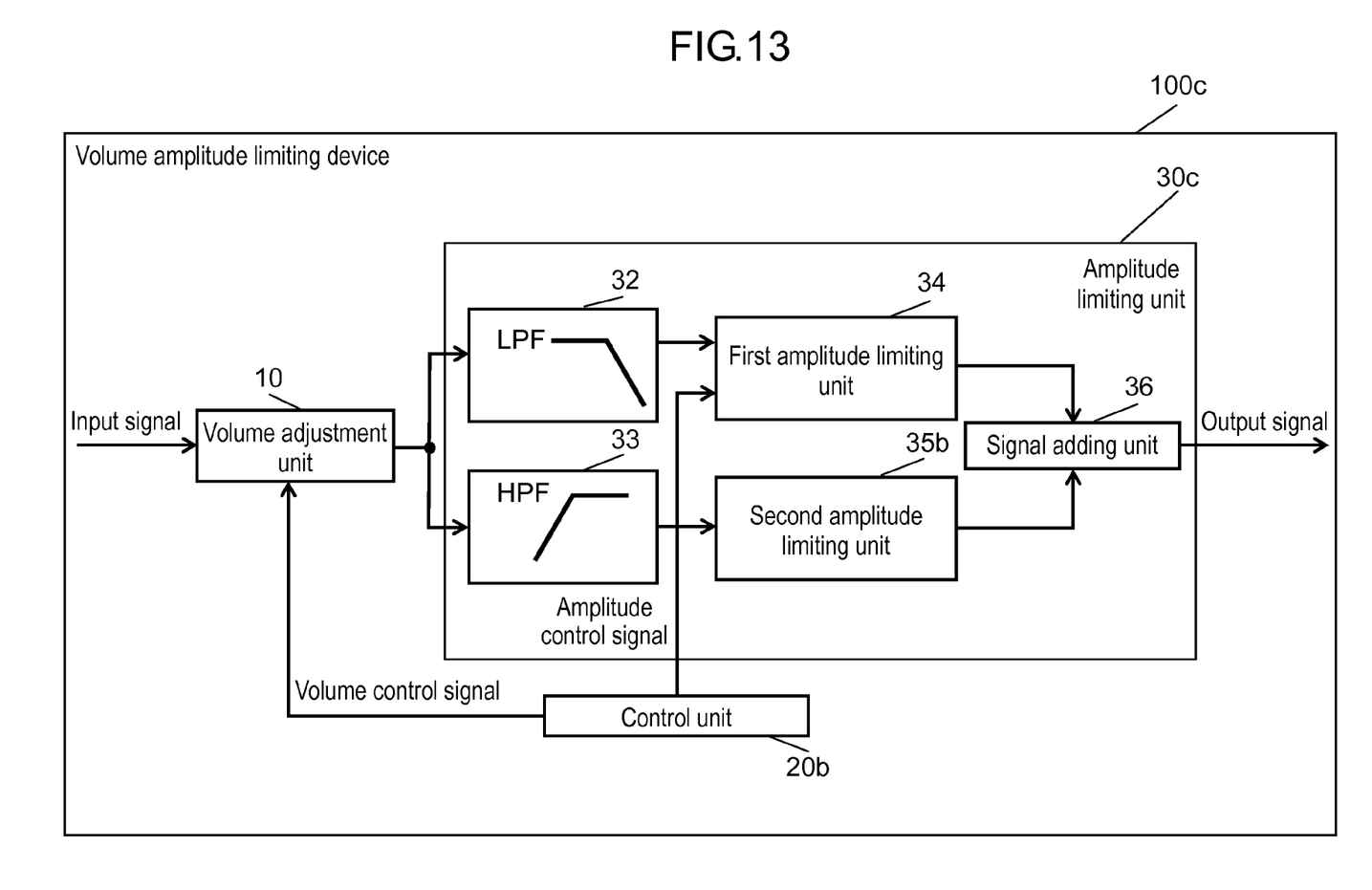
FIG. 13 is a block diagram showing a configuration of a volume amplitude limiting device according to the third exemplary embodiment of the present invention.

In the second embodiment, as shown in FIG. 7, volume amplitude limiting device 100a separates a sound signal output from volume adjustment unit 10 into two frequency bands and inputs the resulting signals to first amplitude limiting unit 34 and second amplitude limiting unit 35a, respectively. Control unit 20a exercises control for setting different output limitation values to first amplitude limiting unit 34 and to second amplitude limiting unit 35a. The third embodiment is different from the second in that, as shown in FIG. 13, control unit 20b of volume amplitude limiting device 100c sets different output limitation values only to first amplitude limiting unit 34. In this embodiment, a description is made mainly of matters different from the second embodiment; an equivalent component is given the same reference mark and its description is sometimes omitted.

FIG. 13 is a block diagram showing a configuration of volume amplitude limiting device 100c according to the third embodiment of the present invention. As shown in FIG. 13, amplitude limiting unit 30c includes low-pass filter (abbreviated as "LPF" in FIG. 13) 32 as a first bandpass filter that outputs only the low-sound part of a sound signal output from volume adjustment unit 10; high-pass filter (abbreviated as "HPF" in FIG. 13) 33 as a second bandpass filter that outputs only the middle-sound part to high-sound part of a sound signal output from volume adjustment unit 10; first amplitude limiting unit 34 that limits the amplitude of a sound signal output from first bandpass filter 32 and outputs the resulting signal; second amplitude limiting unit 35b that limits the amplitude of a sound signal output from second bandpass filter 33 and outputs the resulting signal; and signal adding unit 36 that adds a sound signal output from unit 34 and a sound signal output from unit 35b and outputs the resulting signal to a speaker. Control unit 20b sets the first output limitation value for first amplitude limiting unit 34 according to an adjustment value having been set.

As described above, control unit 20b of volume amplitude limiting device 100c according to the embodiment exercises control for setting a different output limitation value only to first amplitude limiting unit 34. Further, control unit 20b sets the first output limitation value for first amplitude limiting unit 34 so as not to change or to increase as the adjustment value increases.

When the adjustment value having been set is not larger than a given value, control unit 20b sets the first output limitation value for first amplitude limiting unit 34 below or equal to the upper limit in a range within which speaker distortion does not occur. When the adjustment value having been set is not larger than the given value, control unit 20 sets the first output limitation value for amplitude limiting unit 34 to a value between the upper limit (where the adjustment value having been set is not larger than the given value) and the given maximum value.

Figure 14:
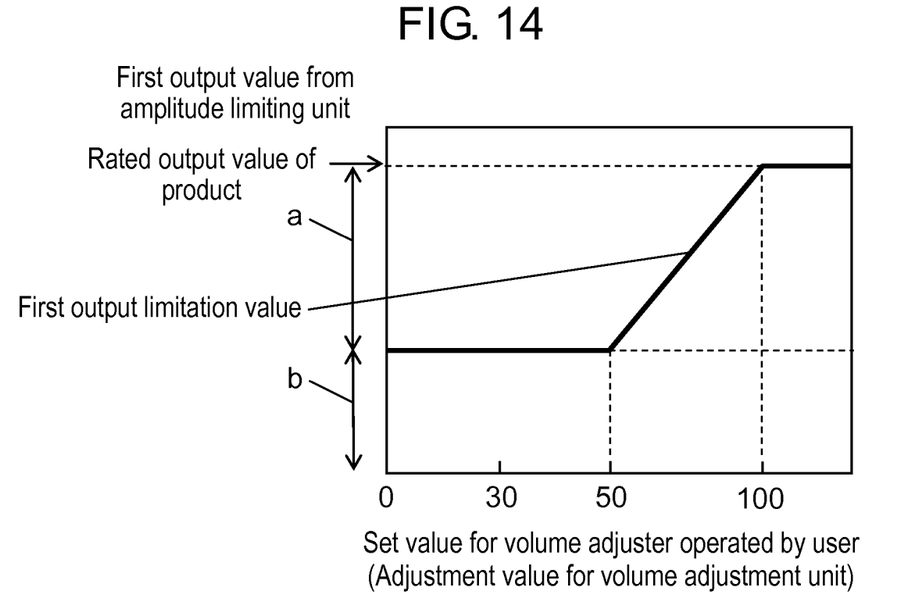
FIG. 14 shows an example of a concept by which the control unit of the volume amplitude limiting device controls the first amplitude limiting unit according to the third exemplary embodiment of the present invention.
Figure 15:
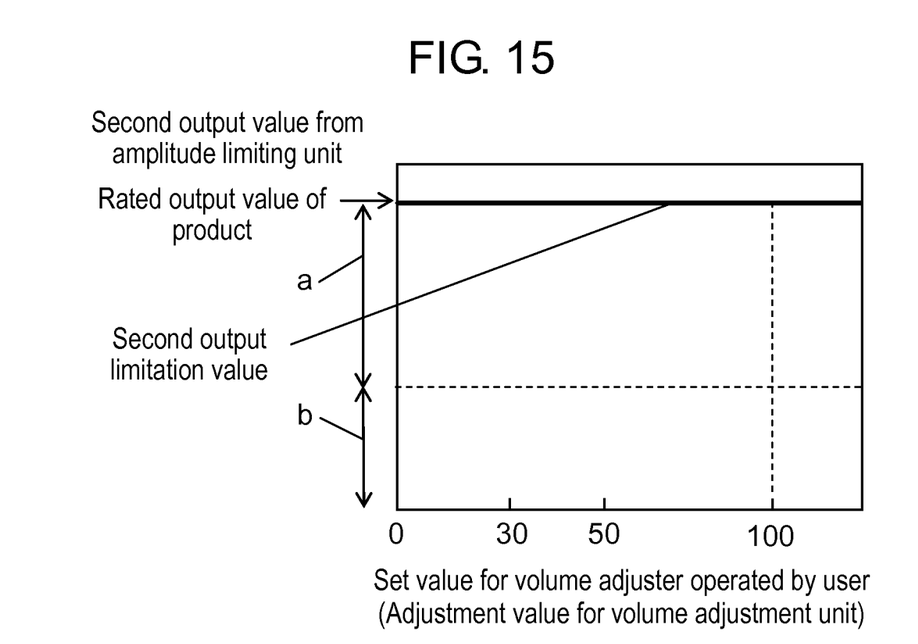
FIG. 15 shows an example of a concept of operation of the second amplitude limiting unit of the volume amplitude limiting device according to the third exemplary embodiment of the present invention.

FIG. 14 shows an example of a concept by which control unit 20b of volume amplitude limiting device 100b controls amplitude limiting unit 30b. FIG. 15 shows an example of a concept of operation of second amplitude limiting unit 35b according to the third embodiment of the present invention. As shown in FIG. 14, control unit 20b performs operation same as that in which control unit 20a controls the first output limitation value for first amplitude limiting unit 34, described using FIG. 8. As shown in FIG. 15, it is necessary only that the second output limitation value for second amplitude limiting unit 35b be set to a value not smaller than the first output limitation value shown in FIG. 14 for example. More concretely, the second output limitation value may be set to the rated output value according to the product specifications.

With such a configuration, when the set value for the volume adjuster is between "0" and "50", control unit 20b exercises control so as to suppress speaker distortion through output limitation even in a case where range a is applicable within which speaker distortion would occur if output limitation were not performed by first amplitude limiting unit 34. When the set value for the volume adjuster is not smaller than "50", if a large-amplitude input signal is input, speaker distortion is to gradually increase by gradually increasing the set value for the volume adjuster from beyond "50". At the maximum set value for the volume adjuster, a sound signal is output with the rated output value according to the product specifications.

The present invention is widely used to improve performance of a device containing speakers inside its housing, capable of producing high-volume sound, such as an audio device, TV set, and radio.

The invention claimed is:

1. A volume amplitude limiting device comprising:
   a volume adjustment unit that adjusts an amplitude of an input sound signal to a larger degree with increase in an adjustment value and outputs a resulting sound signal;
   an amplitude limiting unit that limits the amplitude of the resulting sound signal output from the volume adjustment unit to an output limitation value and outputs a second resulting sound signal to a speaker; and
   a control unit that sets the adjustment value for the volume adjustment unit and sets the output limitation value for the amplitude limiting unit according to the adjustment value;
   wherein the control unit sets the output limitation value for the amplitude limiting unit
      to an upper limit in a range within which speaker distortion does not occur when the adjustment value having been set is not larger than a given value, and
      to a value between the upper limit and a given maximum value when the adjustment value having been set is larger than the given value.

2. The volume amplitude limiting device according to claim 1, wherein the control unit sets the output limitation value for the amplitude limiting unit so as not to change or to increase as the adjustment value increases.

3. A volume amplitude limiting device comprising:
   a volume adjustment unit that adjusts an amplitude of an input sound signal to a larger degree with increase in an adjustment value and outputs a resulting sound signal;
   an amplitude limiting unit that limits the amplitude of the resulting sound signal output from the volume adjustment unit to an output limitation value and outputs a second resulting sound signal to a speaker; and
   a control unit that sets the adjustment value for the volume adjustment unit and sets the output limitation value for the amplitude limiting unit according to the adjustment value;
   wherein the control unit sets the output limitation value for the amplitude limiting unit
      to a value not larger than an upper limit in a range within which speaker distortion does not occur when the adjustment value having been set is not larger than a given value, and
      to a value between the upper limit and a given maximum value when the adjustment value having been set is larger than the given value.

4. The volume amplitude limiting device according to claim 3, wherein the control unit sets the output limitation value for the amplitude limiting unit so as not to change or to increase as the adjustment value increases.

5. A volume amplitude limiting device, comprising:
   a volume adjustment unit that adjusts an amplitude of an input sound signal to a larger degree with increase in an adjustment value and outputs a resulting sound signal;

an amplitude limiting unit that limits the amplitude of the resulting sound signal output from the volume adjustment unit to an output limitation value and outputs a second resulting sound signal to a speaker; and a control unit that sets the adjustment value for the volume adjustment unit and sets the output limitation value for the amplitude limiting unit according to the adjustment value;

wherein the amplitude limiting unit comprises:

a first amplitude limiting unit;

a second amplitude limiting unit;

a first bandpass filter that outputs only a low-sound part of the resulting sound signal output from the volume adjustment unit;

a second bandpass filter that outputs only middle-sound part to high-sound part of the resulting sound signal output from the volume adjustment unit; and a signal adding unit;

wherein the first amplitude limiting unit limits an amplitude of sound signal output from the first bandpass filter, and outputs a third resulting sound signal;

wherein the second amplitude limiting unit limits an amplitude of sound signal output from the second bandpass filter, and outputs a fourth resulting sound signal;

wherein the signal adding unit adds the third resulting sound signal output from the first amplitude limiting unit and the fourth resulting sound signal output from the second amplitude limiting unit and outputs the second resulting sound signal to the speaker; and wherein the control unit sets a first output limitation value for the first amplitude limiting unit and a second output limitation value for the second amplitude limiting unit according to the adjustment value having been set.

6. The volume amplitude limiting device according to claim 5, wherein the control unit sets the first output limitation value for the first amplitude limiting unit and the second output limitation value for the second amplitude limiting unit so as not to change or to increase as the adjustment value increases.

7. The volume amplitude limiting device according to claim 5, wherein the control unit sets the first output limitation value for the first amplitude limiting unit:

to an upper limit in a range within which speaker distortion does not occur when the adjustment value having been set is not larger than a given value; and to a value between the upper limit and a given maximum value when the adjustment value having been set is larger than the given value, and wherein the control unit sets the second output limitation value for the second amplitude limiting unit to a value larger than the first output limitation value for the first amplitude limiting unit.

8. The volume amplitude limiting device according to claim 5, wherein the control unit sets the first output limitation value for the first amplitude limiting unit:

to a value not larger than an upper limit in a range within which speaker distortion does not occur when the adjustment value having been set is not larger than a given value; and to a value between the upper limit and a given maximum value when the adjustment value having been set is larger than the given value, and wherein the control unit sets the second output limitation value for the second amplitude limiting unit to a value between the upper limit and the given maximum value.

9. The volume amplitude limiting device according to claim 5, wherein the control unit sets the first output limitation value for the first amplitude limiting unit to an upper limit in a range within which speaker distortion does not occur when the adjustment value having been set is not larger than a given value;

wherein the control unit increases the first output limitation value for the first amplitude limiting unit, in a range from the upper limit to a given maximum value, in a first given increment for every second given increment of the adjustment value when the adjustment value having been set is larger than the given value; and wherein the control unit sets the second output limitation value for the second amplitude limiting unit to a value between the upper limit and the given maximum value.

10. The volume amplitude limiting device according to claim 5, wherein the control unit sets the output limitation value for the amplitude limiting unit so as not to change or to increase as the adjustment value increases.

11. A volume amplitude limiting device, comprising:

a volume adjustment unit that adjusts an amplitude of an input sound signal to a larger degree with increase in an adjustment value and outputs a resulting sound signal;

an amplitude limiting unit that limits the amplitude of the resulting sound signal output from the volume adjustment unit to an output limitation value and outputs a second resulting sound signal to a speaker; and a control unit that sets the adjustment value for the volume adjustment unit and sets the output limitation value for the amplitude limiting unit according to the adjustment value;

wherein the amplitude limiting unit comprises:

a first amplitude limiting unit;

a second amplitude limiting unit;

a first bandpass filter that outputs only a low-sound part of the resulting sound signal output from the volume adjustment unit;

a second bandpass filter that outputs only middle-sound part to high-sound part of the resulting sound signal output from the volume adjustment unit; and a signal adding unit;

wherein the first amplitude limiting unit limits an amplitude of sound signal output from the first bandpass filter, and outputs a third resulting sound signal;

wherein the second amplitude limiting unit limits an amplitude of sound signal output from the second bandpass filter, and outputs a fourth resulting sound signal;

wherein the signal adding unit adds the third resulting sound signal output from the first amplitude limiting unit and the fourth resulting sound signal output from the second amplitude limiting unit and outputs the second resulting sound signal to the speaker; and wherein the control unit sets a first output limitation value for the first amplitude limiting unit according to the adjustment value having been set.

12. The volume amplitude limiting device according to claim 11, wherein the control unit sets the first output limitation value for the first amplitude limiting unit so as not to change or to increase as the adjustment value increases.

13. The volume amplitude limiting device according to claim 11, wherein the control unit sets the first output limitation value for the first amplitude limiting unit:

to a value not larger than an upper limit in a range within which speaker distortion does not occur when the adjustment value having been set is not larger than a given value; and to a value between the upper limit and a given maximum value when the adjustment value having been set is larger than the given value.

14. The volume amplitude limiting device according to claim 11, wherein the control unit sets the output limitation value for the amplitude limiting unit so as not to change or to increase as the adjustment value increases.

* * * * *